US006090528A

United States Patent [19]
Gordon et al.

[11] Patent Number: 6,090,528
[45] Date of Patent: Jul. 18, 2000

[54] SPOT-TO-SPOT STITCHING IN ELECTRON BEAM LITHOGRAPHY UTILIZING SQUARE APERTURE WITH SERRATED EDGE

[76] Inventors: Michael S. Gordon, 7 Dayton Dr., Lincolndale, N.Y. 10540; John G. Hartley, 267 Addison Rd., Fishkill, N.Y. 12524

[21] Appl. No.: 09/428,601

[22] Filed: Oct. 27, 1999

[51] Int. Cl.[7] ........................................ G03C 5/00
[52] U.S. Cl. ..................... 430/296; 430/396; 430/942
[58] Field of Search ................................. 430/296, 942, 430/396, 5

[56] References Cited

U.S. PATENT DOCUMENTS

| | | |
|---|---|---|
| 3,894,271 | 7/1975 | Pfeiffer et al. . |
| 3,930,181 | 12/1975 | Pfeiffer . |
| 4,243,866 | 1/1981 | Pfeiffer et al. . |
| 4,423,305 | 12/1983 | Pfeiffer . |
| 4,902,899 | 2/1990 | Lin et al. ............................... 250/492.1 |
| 5,523,580 | 6/1996 | Davis .................................... 250/505.1 |
| 5,895,736 | 4/1999 | Nakajima ................................. 430/30 |

*Primary Examiner*—Christopher G. Young
*Attorney, Agent, or Firm*—Brinks Hofer Gilson & Lione

[57] ABSTRACT

The invention relates to the field of electron beam lithography. More particularly, the invention relates to shaped beam lithography for generating variable-shaped spots on photoresist for use in integrated circuit manufacturing processes. According to an aspect of the invention, an electron beam lithography method is provided, having the steps of generating an electron beam and directing it through a first square aperture in a first lamina, the first square aperture having a first serrated edge. According to a further aspect of the invention, the beam emanating from the first square aperture in the first lamina is focused onto a second square aperture in a second lamina having a second serrated edge. The spot generated has a subresolution edge zone induced at least in part by the first serrated edge and/or the second serrated edge.

20 Claims, 2 Drawing Sheets

SPOT-TO-SPOT STITCHING IN ELECTRON BEAM LITHOGRAPHY UTILIZING SQUARE APERTURE WITH SERRATED EDGE

BACKGROUND

The invention relates to the field of electron beam lithography. More particularly, the invention relates to shaped beam lithography for generating patterns on photoresist for use in integrated circuit manufacturing processes.

According to prior art methods, an e-beam system's computer breaks a desired pattern into individual spots and then writes and stitches the spots together on a wafer or other substrate to generate a representation of the pattern, typically in a layer of photoresist layered on the substrate. In state of the art shaped electron beam systems, the individual spots can vary in size from a sliver (for example 0.1 $\mu$m×2.0 $\mu$m) to a square (for example 2.0 $\mu$m×2.0 $\mu$m). The shaping system on the e-beam column is calibrated so that the spot size on the target (wafer or other substrate) matches that which is desired. In practice, individual spots are written and positioned at a spatial period that matches the desired spot size. The gain of the shaping system is adjusted and the deflection system calibrated so that there is no gap or bulge in adjacent spots on exposed photoresist.

Referring now to FIG. 1, three examples of spot-to-spot stitching are presented according to the prior art. In the first example the e-beam system perfectly positions two spots 10. The pattern of exposed photoresist comprises two exposed spots 20 that match the desired pattern. In the second example, the e-beam system slightly mispositions two spots 12 with a small gap therebetween. This same gap would occur for correctly-positioned spots that were too small. The resulting pattern of exposed photoresist comprises two exposed spots 22 with a pair of indents 23. In the third example, the e-beam system slightly mispositions two spots 14 with a small overlap. The resulting pattern of exposed photoresist comprises two exposed spots 24 with a pair of cusps 25. These same cusps would occur for correctly-positioned spots that were too large. Electronic noise in either or both of the spot shaping electronics or the spot positioning electronics will make the gap or bulge between the spots variable, contributing to the linewidth variation.

Linewidth variation is an important factor in current integrated circuit design and fabrication. The acceptable variation in linewidth expressed as 3 $\sigma$ variation is generally about 10% of the minimum feature size written (e.g., 10 nm for 100 nm minimum feature size). Therefore, an electron beam lithography process that provides reduced linewidth variation is generally desired.

SUMMARY OF THE INVENTION

According to an aspect of the invention, an electron beam lithography method is provided, comprising the steps of generating an electron beam and directing it through a first square aperture in a first lamina, the first square aperture having a first serrated edge. According to a further aspect of the invention, the beam emanating from the first square aperture in the first lamina is focused onto a second square aperture in a second lamina having a second serrated edge. The image of the first square aperture at the plane of the second square aperture can be deflected onto different positions onto the second square aperture. The resultant compound image (square or rectangle) is projected onto photoresist layered on a substrate. The size of the serrations on the first and second apertures is small enough that when projected onto the photoresist it is less than the resolution of the electron beam and thus is "subresolution." The resulting edge zone, or outer area of the rectangular or square spot at the wafer plane, is generated by the first serrated edge, the second serrated edge, or a combination of both. The edge zones on adjacent spots, preferably overlap, which improves the stitching accuracy of these spots.

The method according to the invention reduces linewidth variation, as well as providing other benefits and advantages.

DETAILED DESCRIPTION OF THE PREFERRED EMBODIMENTS

Figure 1:
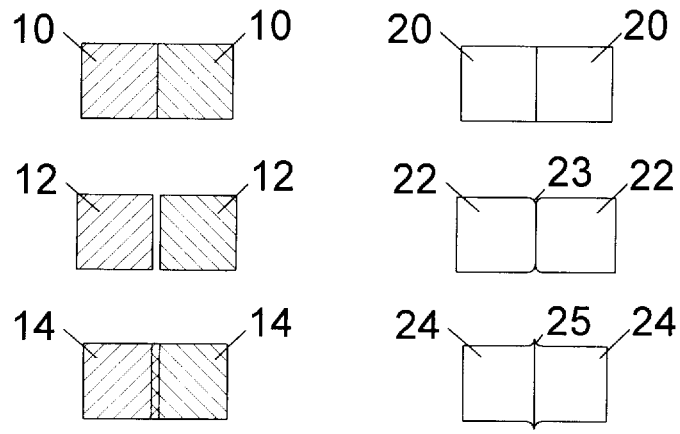
FIG. 1 presents three examples of e-beam spot and photoresist exposure according to the prior art.
Figure 2:
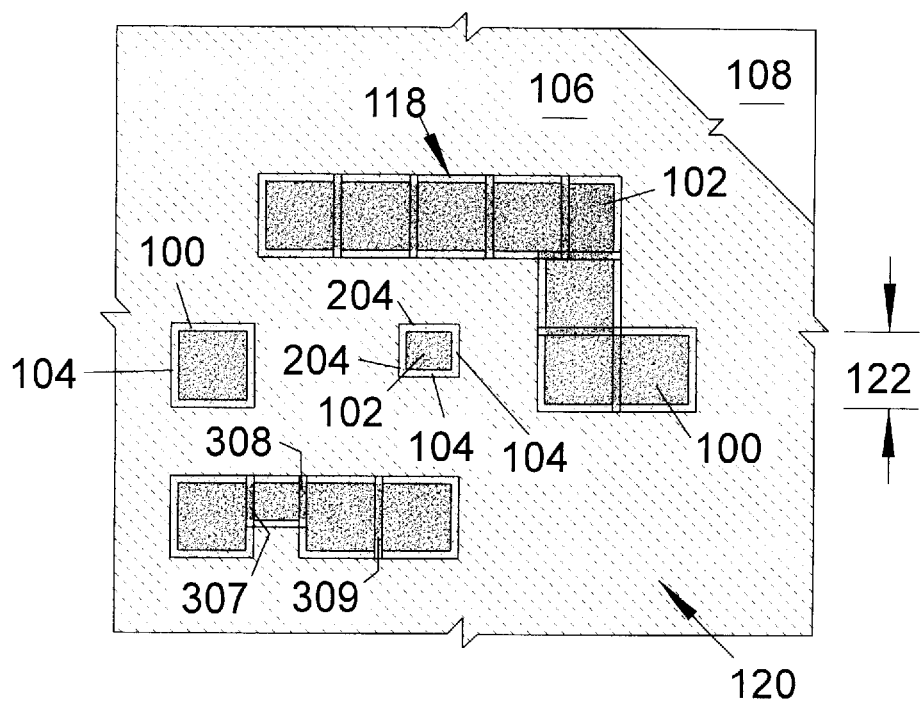
FIG. 2 presents a plan view of e-beam spot and photoresist exposure of a photoresist layered substrate, according to an aspect of the invention.
Figure 3:
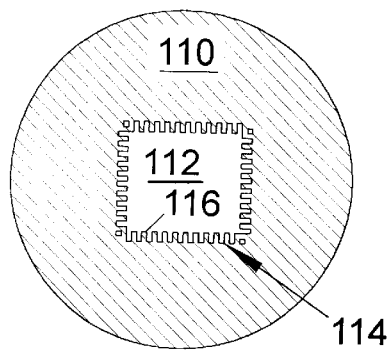
FIG. 3 presents a plan view of a first lamina having a first square aperture with a first serrated edge, according to an aspect of the invention.
Figure 4:
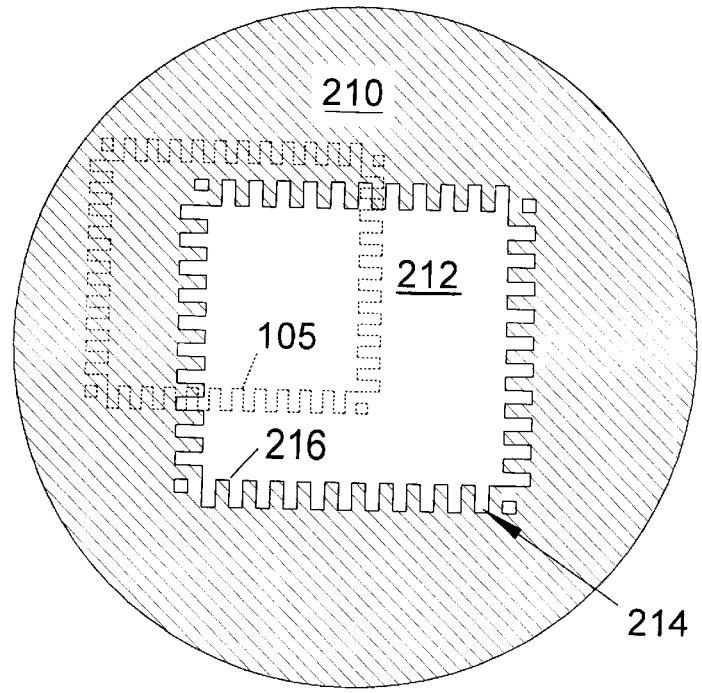
FIG. 4 presents a plan view of a second lamina having a second square aperture with a second serrated edge. The image of the first aperture is shown at the plane of the second aperture and is slightly smaller than and overlaid on top of the second aperture with a second serrated edge, according to a further aspect of the invention.

Various aspects of the invention are presented in FIGS. 2–5, which are not drawn to scale, and wherein like components in the various views are numbered alike. Referring now specifically to FIG. 2, an electron beam lithography method is presented according to an aspect of the invention comprising using a shape generator in a computer to break up the desired pattern to be written on the photoresist into individual spots. The maximum size spot is a square with dimensions consistent with the size of the demagnified image of the first square aperture 112 of FIG. 3 (as discussed below). The method further comprises generating an electron beam (not shown) and flooding a first square aperture 112 with said beam. The beam emanating from first square aperture 112 is deflected and imaged onto a second square aperture 212 as shown in FIG. 4 (as discussed below) thereby creating a compound image. The compound image is demagnified as a square or rectangular spot 100 or 102 onto photoresist 106 layered on substrate 108, and positioning where designed to fabricate the desired pattern. The edge zones of adjacent spots 100 or 102 adjoin each other as described below, and preferably overlap each other, at least in part.

Representing the electron beam and describing how it is generated and controlled is well known in the art and need not be reproduced here. Reference is made to U.S. Pat. No. 3,894,271 entitled Method and Apparatus for Aligning Electron Beams, which is fully incorporated by reference as if set forth herein. Reference is also made to U.S. Pat. No. 4,243,866 entitled Method and Apparatus for Forming a Variable Size Electron Beam, which is also fully incorporated by reference as if set forth herein. The '271 patent describes an apparatus and process for generating a square spot using a single square aperture, and the '866 patent describes an apparatus and process for generating a square or rectangular spot using two square apertures.

Character projection is an extension of the variable size electron beam concept, where the lower aperture is replaced with many characters, often including a square. The beam emanating from the first square aperture is deflected onto a character (often a DRAM cell) and then further demagnified and projected to the target. The present invention may be employed in these and other electron beam apparatus and processes.

Figure 6:
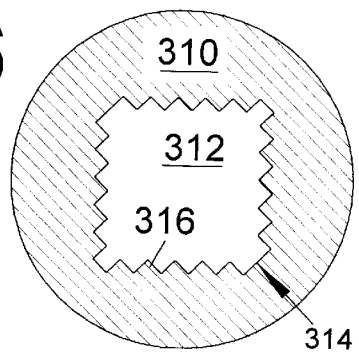
FIG. 6 presents an alternative embodiment of the serrated edge of an aperture.

Referring now to FIG. 3, the method according to a further aspect of the invention comprises the step of shaping the electron beam by directing it through a first square aperture 112 in a first lamina 110. The first square aperture 112 has a first serrated edge 114. The first serrated edge 114 may comprise only a portion of the internal edge that defines the first square aperture 112 or, as in a preferred embodiment, the first serrated edge 114 encircles the first square aperture 112 as shown in FIG. 3. The first serrated edge 114 may be configured as a first row of parallel fingers 116. Other configurations are contemplated in the practice of the invention. For example, FIG. 6 shows an alternative embodiment of the serrated edge, wherein a lamina 310 is provided having an aperture 312 with serrated edge 316 comprising saw teeth.

The serrated edge is not actually resolved on the photoresist. By way of example, consider an electron beam lithography tool that demagnifies the first aperture 112 one hundred times to its final spot size of 2 $\mu$m at the wafer plane and the resolution of the spot is ~20 nm. As long as the dimensions of the parallel fingers 116 are smaller than ~2 $\mu$m, they will not be clearly resolved in the photoresist, but will contribute electron dose. The parallel fingers 116 of first aperture 112 generate a subresolution edge zone 104 as shown in FIG. 2. The first lamina 110 may be a plate or a foil, and the first lamina 110 may be thick enough to absorb electrons that strike it (stencil), or elastically scatter electrons that penetrate it (scattering). An advantage to the scattering type of lamina is that it does not heat up as much as the stencil type when the beam impinges upon it.

The scattering-type of aperture could be made using standard x-ray mask or SCALPEL® mask-fabrication techniques and details are included in prior art publications, for example S. D. Berger and J. M. Gibson, Appl. Phys Lett. 57, 153 (1990). The aperture 112, and serrated edges 114 of parallel fingers, or other design, is patterned using electron beam lithography or other high-resolution lithography, so that the features are well defined on the lamina. Materials for the lamina 110 could include silicon, silicon-carbide, silicon nitride, diamond or like substances. The thickness of the lamina 110 in the region near the aperture 112 would be in the range 0.1 $\mu$m–5 $\mu$m. To make the lamina 10 self-supporting, the region of the lamina several beam dimensions away from the center of the aperture 112 would be several hundred micrometers thick.

Stencil-type apertures, on the other hand, have lamina regions 110 thick enough to stop the primary beam (e.g., the thickness of the lamina region must be greater than the range of the electrons in the material). For instance, 100 kV electrons have a range of about 7.5 $\mu$m in Au, or about 16 $\mu$m in Cu. These apertures could be made using standard LIGA® (x-ray exposure and electroplating) techniques, which are described in W. Ehrfeld and A. Schmidt, J. Vac. Sci. Technol. B, Vol. 16, No. 6, P. 3526–34 (Nov./Dec. 1998). In all cases, the aperture materials must be non-magnetic to avoid causing perturbations in the beam.

Referring now to FIG. 4, the step of shaping the electron beam may further comprise the step of directing the electron beam which emanates from the first aperture 112, onto or through a second square aperture 212 in a second lamina 210, the second square aperture 212 comprising a second serrated edge 214 of second parallel fingers 216. FIG. 4 also shows an outline of the image of the first aperture 105 at the plane of the second aperture lamina 210. Through the shaping electronics described in the prior art, the image of the first aperture is shifted onto the second aperture as shown. The overlap of the two apertures can create a smaller square, or rectangular spot at both the plane of the second aperture and the photoresist at the wafer plane. For ease of description, the size of the image of the first aperture 105 at the plane of the second aperture lamina 210 is shown smaller than the second aperture 212, but those skilled in the art recognize that a similar description of the invention would result if the image of the first aperture 105 were larger than the second aperture 212. For the case of a shaped spot as shown in FIG. 2, the spot at the photoresist will have composite subresolution edge zones; the right and bottom edge zones 104 are induced by the first serrated edge 114 of the first aperture 112 (FIG. 3) and the top and left-hand edge zones 204 induced by the second serrated edge 214 of the second aperture 212 (FIG. 4).

Still referring to FIG. 4, the second square aperture 212 has a second serrated edge 214, and the edge zone 204 is induced at least in part by the second serrated edge 214. The second serrated edge 214 may comprise only a portion of the internal edge that defines the second square aperture 212 or, as in a preferred embodiment, the second serrated edge 214 encircles the second square aperture 212 as shown in FIG. 4. The second serrated edge 214 may also be configured as a second row of parallel rectangular fingers 216 and may also be subresolution, as previously described in relation to the first row of parallel rectangular fingers 116. The second lamina 210 may be a plate or a foil, and the second lamina 210 may be designed to absorb electrons that strike it, or scatter electrons that penetrate it. Materials and methods previously described in relation to the first lamina 110 may also be employed in making the second lamina 210. Depending on the electron optics of an electron beam column employing this invention, the first aperture 112 might be larger, smaller, or the same size as the second aperture 212. The relationship between the size of the fingers 116 of the first aperture 112 compared to the lateral extent of the aperture 112 is the same as the size of the fingers 216 of the second aperture 212 compared to the lateral extent of the aperture 212. In that way, when the first aperture 112 is imaged onto and shifted over the second aperture 212, the fingers from both apertures are similar in size.

At the bottom of FIG. 2 is shown a combination of shaped and full-size spotse that have been placed adjacent to one another. There is an intersection 307 that combines the right-hand side of a full spot with the left-hand size of a shaped spot, an intersection 308 that combines the left-hand side of a full spot and the right-hand side of a shaped spot, and an intersection 309 that combines the right and left-hand size of full spots. Intersections 307 and 308 contain a combination of edge zones 104 and 204, and intersection 309 contains an overlapping region of edge zone 104 from the adjacent spots. The pattern 120 exposed on the photoresist 106 is generated by successive individual exposures of full spots 100 or shaped spots 102 with edge zones 104, 204 or a combination of them at the intersection region.

Figure 5:
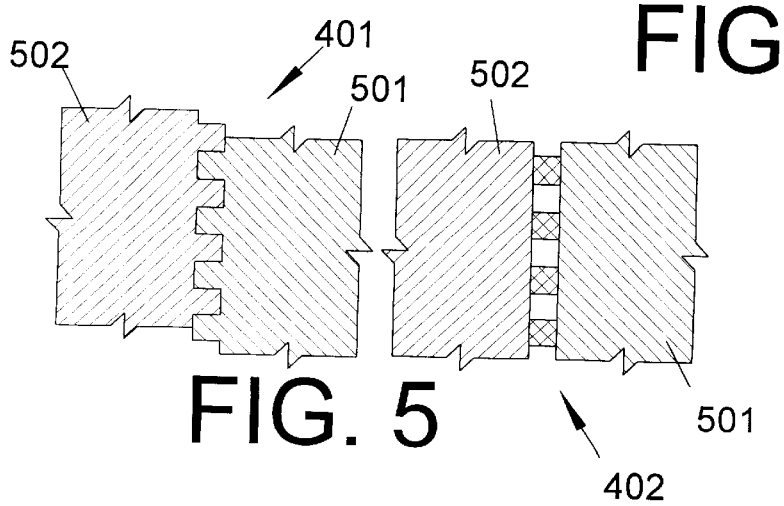
FIG. 5 shows a detail of the region at the intersection of adjacent spots according to an aspect of the invention.

FIG. 5 shows an idealized, enlarged view of a portion of the intersecting region of adjacent spots 501 and 502. As mentioned earlier, the fingers on the apertures are subresolution, but they are shown as fully resolved in the figure to clarify the discussion. As shown in the figure, the overlap between the finger in the edge zone can be interleaved 401 or overlapped 402. In the interleaved case, the electron dose at this edge zone impinging on the photoresist is smoothly-varying in the vertical direction. In the overlapping case, the electron dose at this edge zone is discontinuous along the vertical direction; where the fingers overlap there is twice the dose, and where the fingers do not overlap there is no dose. It should be readily apparent to those skilled in the art that a combination of the interleaved and overlapping case is possible. In a specific embodiment, both the minimum shaping increment and the minimum positioning increment (both referred to the wafer plane) match and are equal in size to the pitch of the fingers (referred to the wafer plane). Pitch is the space between fingers. The pitch is preferably equal to the minimum shape increment times the demagnification or some multiple thereof, such that the result is subresolution. For example, for a 1 nm minimum shaping increment and a demagnification ratio for the second aperture 212 of 100, the pitch of the fingers 216 needs to be 100 nm in dimension. For this specific embodiment, the interleaved edge zone 401 provides for uniform dose distribution at the boundary between the adjacent spots, and the less desirable case shown in 402 should not occur.

The method of the invention is particularly suited for rendering patterns in photoresist or other materials for manufacturing either masks for x-ray lithography, reduction light optics or projection beam lithography, direct-write lithography, or other applications requiring precise control of linewidth. A measure of performance of the lithographic tool is the variation in size of the linewidth, usually expressed as 3 times the standard deviation of the mean linewidth. The edge zones 104 or 204 between adjacent spots should reduce this variation as mentioned previously.

Although the invention has been described and illustrated with reference to specific illustrative embodiments thereof, it is not intended that the invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. An electron beam lithography method, comprising the steps of:
    generating an electron beam;
    shaping said electron beam by directing it through a first square aperture in a first lamina, said first square aperture having a first serrated edge; and,
    projecting said electron beam as a square spot onto photoresist layered on a substrate, said spot comprising a subresolution edge zone induced at least in part by said first serrated edge.

2. The method of claim 1, wherein said first serrated edge encircles said first aperture.

3. The method of claim 1, wherein said step of shaping said electron beam further comprises the step of directing said electron beam through a second square aperture in a second lamina, said second square aperture comprising a second serrated edge, said spot comprising a subresolution edge zone induced at least in part by said first serrated edge or said second serrated edge, or a combination of both.

4. The method of claim 3, wherein said second serrated edge encircles said second aperture.

5. The method of claim 1, further comprising the step of exposing a pattern of said photoresist by projecting said beam upon said photoresist a multitude of times each time creating one said spot with said edge zone adjoining an adjacent said edge zone of an adjacent said spot.

6. The method of claim 1, further comprising the step of exposing a pattern on said photoresist by projecting said beam upon said photoresist a multitude of times each time creating one said spot with said edge zone overlapping an adjacent said edge zone of an adjacent said spot.

7. The method of claim 1, further comprising the step of exposing a pattern of said photoresist by projecting said beam upon said photoresist a multitude of times each time creating one said spot with said edge zone overlapping an adjacent said edge zone of an adjacent said spot, wherein said pattern is for an integrated circuit.

8. The method of claim 1, wherein said first serrated edge comprises a first row of parallel rectangular fingers extending from said lamina into said aperture.

9. The method of claim 1, wherein said first serrated edge comprises a first row of parallel triangular fingers extending from said lamina into said aperture.

10. The method of claim 1, wherein said lamina is thick enough to stop said electron beam.

11. The method of claim 1, wherein said lamina is thin enough to scatter said electron beam.

12. The method of claim 1, wherein said first serrated edge has a pitch that is equal to the minimum shape increment times the demagnification or some multiple thereof, such that the result is subresolution.

13. The method of claim 1, wherein said first serrated edge and said second serrated edge have a pitch that is equal to the minimum shape increment times the demagnification or some multiple thereof, such that the result is subresolution.

14. An electron beam lithography method, comprising the steps of:
    generating an electron beam;
    shaping said electron beam by directing it through a first square aperture in a first lamina, said first square aperture having a first serrated edge;
    forming a line of exposed photoresist on a substrate by repeatedly projecting said electron beam as a square or rectangular spot onto photoresist layered on said substrate, each said spot comprising a subresolution edge zone induced at least in part by said first serrated edge, said line of exposed photoresist comprising a row of said spots, each exposed only once, with said edge zone of each said spot adjoining an adjacent said edge zone of an adjacent said spot.

15. The method of claim 14, wherein said step of shaping said electron beam further comprises the step of directing said electron beam through a second square aperture in a second lamina, said second square aperture comprising a second serrated edge, said spot comprising a subresolution edge zone induced at least in part by said first serrated edge and said second serrated edge.

16. An electron beam lithography method, comprising the steps of:
    generating an electron beam;
    shaping said electron beam by directing it through a first square aperture in a first lamina, said first square aperture having a first serrated edge encircling said first square aperture, and directing said electron beam through a second square aperture in a second lamina, said second square aperture comprising a second serrated edge encircling said second square aperture; and, projecting said electron beam as a square or rectangular spot onto photoresist layered on a substrate, said spot comprising a subresolution edge zone induced at least in part by said first serrated edge and said second serrated edge.

17. The method of claim 16, further comprising the step of exposing a pattern of said photoresist by projecting said beam upon said photoresist a multitude of times each time creating one said spot with said edge zone adjoining an adjacent said edge zone of an adjacent said spot.

18. The method of claim 16, further comprising the step of exposing a line on said photoresist by projecting said beam upon said photoresist a multitude of times each time creating one said spot with said edge zone adjoining an adjacent said edge zone of an adjacent said spot.

19. The method of claim 16, wherein said first serrated edge comprises a first row of parallel rectangular fingers extending from said lamina into said first aperture, and said second serrated edge comprises a second row of parallel rectangular fingers extending from said lamina into said second aperture.

20. The method of claim 16, wherein said first serrated edge comprises a first row of parallel triangular fingers extending from said lamina into said first aperture, and said second serrated edge comprises a second row of parallel triangular fingers extending from said lamina into said second aperture.

* * * * *